(12) United States Patent
Faifer et al.

(10) Patent No.: US 7,414,409 B1
(45) Date of Patent: *Aug. 19, 2008

(54) NON-CONTACT METHOD AND APPARATUS FOR MEASUREMENT OF LEAKAGE CURRENT OF P-N JUNCTIONS IN IC PRODUCT WAFERS

(76) Inventors: Vladimir Faifer, 1631 N. First St., San Jose, CA (US) 95112; Michael Current, 1631 N. First St., San Jose, CA (US) 95112; Timothy Wong, 1631 N. First St., San Jose, CA (US) 95112

( * ) Notice: Subject to any disclaimer, the term of this patent is extended or adjusted under 35 U.S.C. 154(b) by 326 days.

This patent is subject to a terminal disclaimer.

(21) Appl. No.: 11/207,918

(22) Filed: Aug. 19, 2005

(51) Int. Cl.
 *G01R 31/08* (2006.01)
 *G01R 31/26* (2006.01)
(52) U.S. Cl. .................. 324/522; 324/765
(58) Field of Classification Search .......... 324/522, 324/512, 500, 765, 750, 751, 752, 715, 716, 324/717, 718, 719, 158.1; 438/16, 17; 257/48
See application file for complete search history.

(56) References Cited

U.S. PATENT DOCUMENTS

| | | | | |
|---|---|---|---|---|
| 5,841,294 A | * | 11/1998 | Jang et al. | 324/765 |
| 6,549,868 B2 | * | 4/2003 | Takeda | 702/121 |
| 6,922,067 B1 | * | 7/2005 | Van et al. | 324/752 |
| 7,019,513 B1 | * | 3/2006 | Faifer et al. | 324/158.1 |
| 7,180,586 B2 | * | 2/2007 | Neumann et al. | 356/237.5 |
| 7,202,691 B2 | * | 4/2007 | Lagowski et al. | 324/765 |
| 2005/0219498 A1 | * | 10/2005 | Mori | 355/69 |

* cited by examiner

*Primary Examiner*—Vincent Q. Nguyen
*Assistant Examiner*—Hoai-An D Nguyen

(57) ABSTRACT

A non-contact apparatus and method for measuring of the leakage current and capacitance of p-n junctions in test structures within scribe lanes of IC product wafers is disclosed. The apparatus has a light source optically coupled with a fiber to a transparent electrode at the end of the fiber, which is brought close to the p-n junction under test. The ac signal generated from the test p-n junction is captured by this transparent and conducting coating electrode. The leakage current of a test p-n junction is determined using the frequency dependence of junction photo-voltage signal and reference signals from a p-n junction with low leakage current and known capacitance.

9 Claims, 5 Drawing Sheets

NON-CONTACT METHOD AND APPARATUS FOR MEASUREMENT OF LEAKAGE CURRENT OF P-N JUNCTIONS IN IC PRODUCT WAFERS

BACKGROUND OF THE INVENTION

The present invention relates to the non-contact measurement of leakage current of p-n junctions in test structures located in the scribe lanes of IC product wafers using a junction photo-voltage (JPV) technique As the number of transistors per IC increases, the contribution to dynamic and standby power drains from transistor junction leakage currents poses increasing limitations to the implementation of advanced technology designs and a serious power drain for battery-powered systems. Many process factors associated with the fabrication of ultra-shallow junctions (USJ), with junction depths less than 30 nm, contribute to the increasing junction leakage current density as transistor size is scaled to smaller dimensions. Monitoring junction leakage current on in-process IC product wafers provides timely input for tuning manufacturing conditions to minimize leakage current levels.

The present invention provides a method and apparatus for non-contact measurements of p-n junction leakage current with spatial resolution (<100 um) consistent with the dimension of test structures in IC wafer scribe lanes.

RELATED APPLICATIONS

U.S. application Ser. No. 10/688,766, Non Contact Method and Apparatus for Measurement of Sheet Resistance of P-N Junctions

SUMMARY OF THE INVENTION

An object of this invention is to provide a method and non-contact apparatus for the measurement of leakage current in p-n junctions located in test structures within the scribe lanes of IC product wafers. The present embodiment of the invention apparatus includes a means for illumination of these p-n junctions with intensity modulated light, an optical fiber with a transparent and conducting coating covering its end, positioned near the p-n junction surface, within a distance of less than 1 micrometer, directing light onto the junction surface, and detection and analysis of the JPV signal from the junction. The various embodiments of the invention apparatus can include an optical pattern recognition and wafer positioning system, the use of light-emitting diodes (LED) or laser diodes as light sources and dielectric coatings on the transparent electrode to provide a fixed probe-to-junction distance.

The invention also provides a non-contact method for measurement of the capacitance of p-n junctions. To obtain accurate measurements, the intensity of the light is adjusted to obtain a linear dependence of the JPV signal from the transparent electrode versus light flux.

This method provides for use of a calibration wafer containing a planar p-n diode with known capacitance. An implementation of the leakage current measurement method uses a comparison of JPV signals for test wafers and a calibration wafer.

An additional procedure of measurement includes illumination of a calibration p-n junction with known capacitance with intensity modulated light; measurement of the JPV signal from this p-n junction at one light modulation frequency; then measurement of the JPV signal from a test p-n junction using at least two light modulation frequencies; and determination of the leakage current of test wafers using measured JPV values from a test p-n junction at two or more frequencies and JPV values from a calibration wafer with a p-n junction with known capacitance.

The present invention also provides a means for increasing the accuracy and versatility of the measurement through several methods; providing a means for checking and adjusting the air gap separation between the probe electrodes and the p-n-junction to establish uniform and known capacitive coupling of the JPV signals, providing a photodiode detector to check the value and uniformity of the surface reflectivity and providing for the use of multiple wavelengths of excitation light to allow for optimal matching between the light penetration depth and junction depths of surface and sub-surface doped layers.

DETAILED DESCRIPTION OF THE APPARATUS AND METHOD

Figure 1:
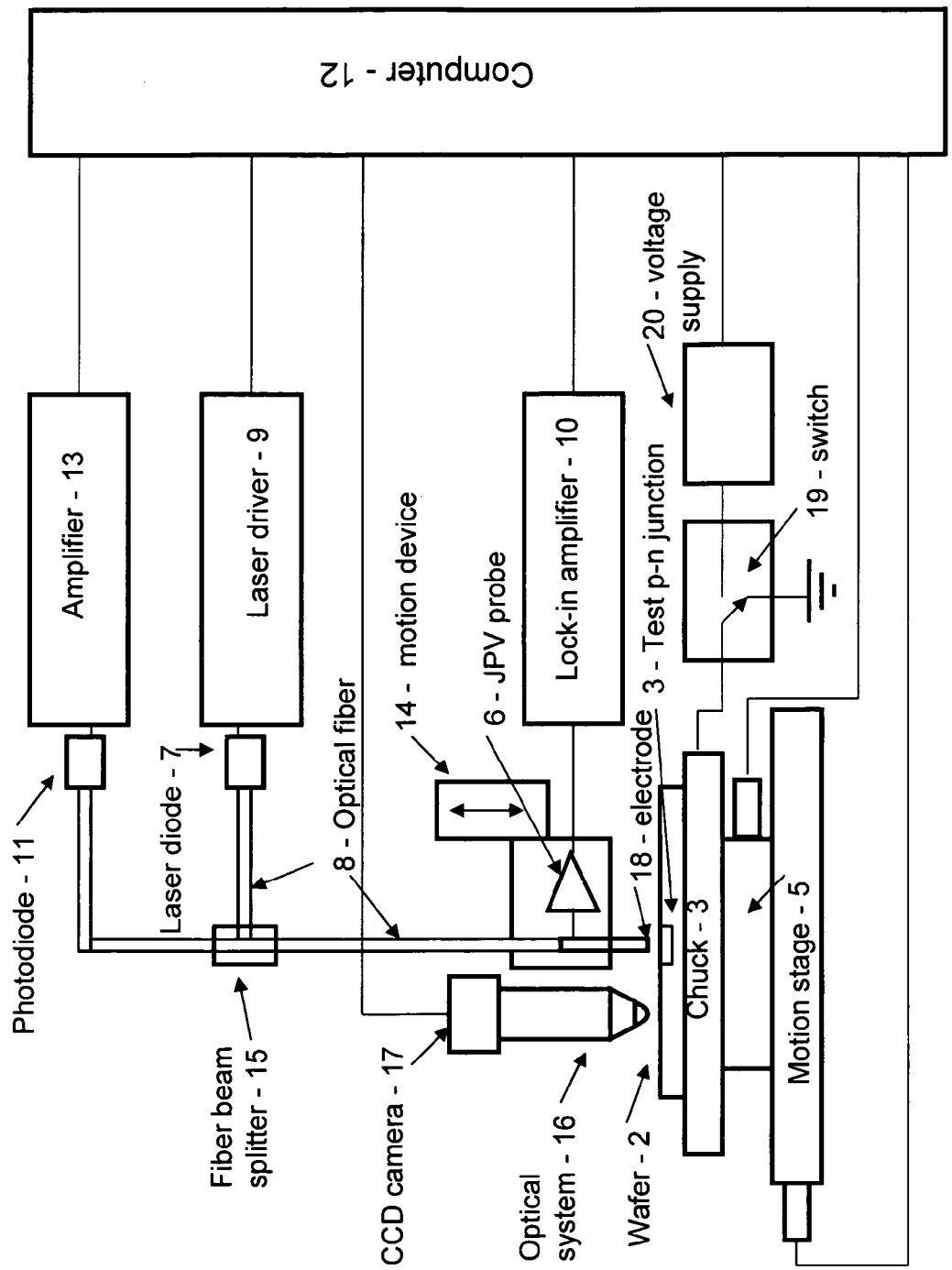
FIG. 1 is a pictorial view of the present embodiment of the invention.

In FIG. 1, a non-contact leakage current apparatus 1 is shown. A wafer 2, containing product IC devices and a test p-n junction 3, is located on a wafer chuck 4. The wafer chuck is placed on a precision motion stage 5. The apparatus comprises a probe 6 for leakage current (L) measurement. An electrode 18 is placed close to the junction surface 3 and is optically coupled to a modulated light source 7, connected to a driver supply 9, through an optical fiber 8. The electrical output of the PV probe 6 is connected to a signal demodulator or lock-in amplifier 10. Signal demodulator 10 and motors of the stage 5 are electrically connected to an interface and a computer 12. The air gap distance between the probe electrode 18 and the p-n junction 3 is controlled through a vertical motion control device 14 to establish a known and uniform capacitive coupling for the JPV signal. The electrical gain of the probe 6 can also be controlled without adjustment of the probe-to-junction gap by use of a voltage supply 20 which can supply a modulated signal through a switch 19 to the wafer chuck 4 for calibration of the air gap distance with a known signal, measured in the absence of the modulated light beam. The optical fiber 8 also communicates the modulated probe light to the p-n junction 3 and back to a photodiode detector 11 and amplifier 13 through a fiber optic beam splitter 15 for measurement of the surface reflectivity.

The apparatus also comprises an optical system 16 with a CCD camera 17 for pattern recognition to provide a means of locating the probe electrode 18 over the test p-n junction diode 3. During leakage current measurements, the probe 18 and p-n junction 3 are placed a light-tight enclosure to avoid noise effects from additional photo-voltage signals created by light sources other than the modulated light source 7. The signal generator 20 and signal demodulators 10 may be replaced by a single lock-in amplifier with an internal signal generator.

Figure 2:
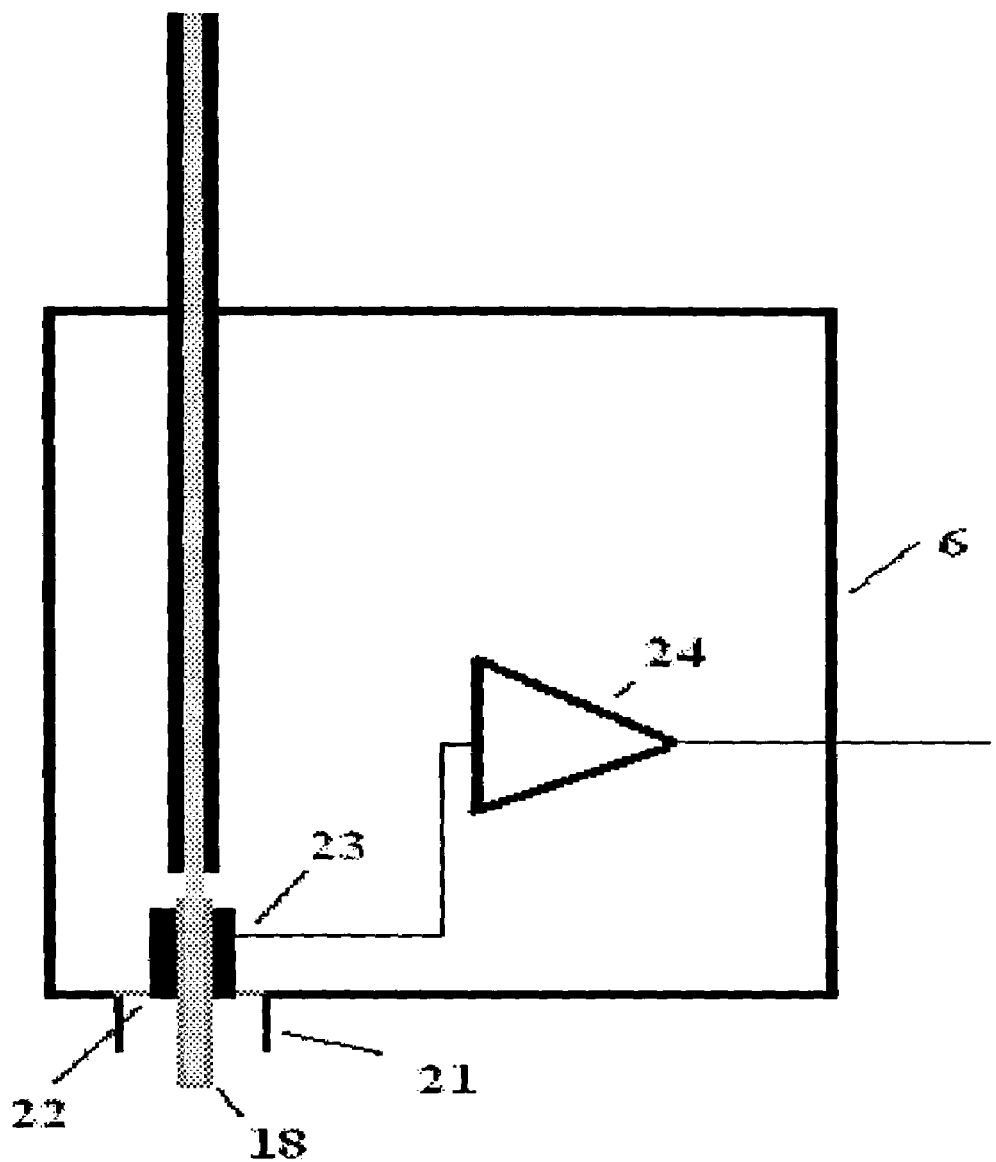
FIG. 2 is a pictorial view of a probe assembly.
Figure 3:
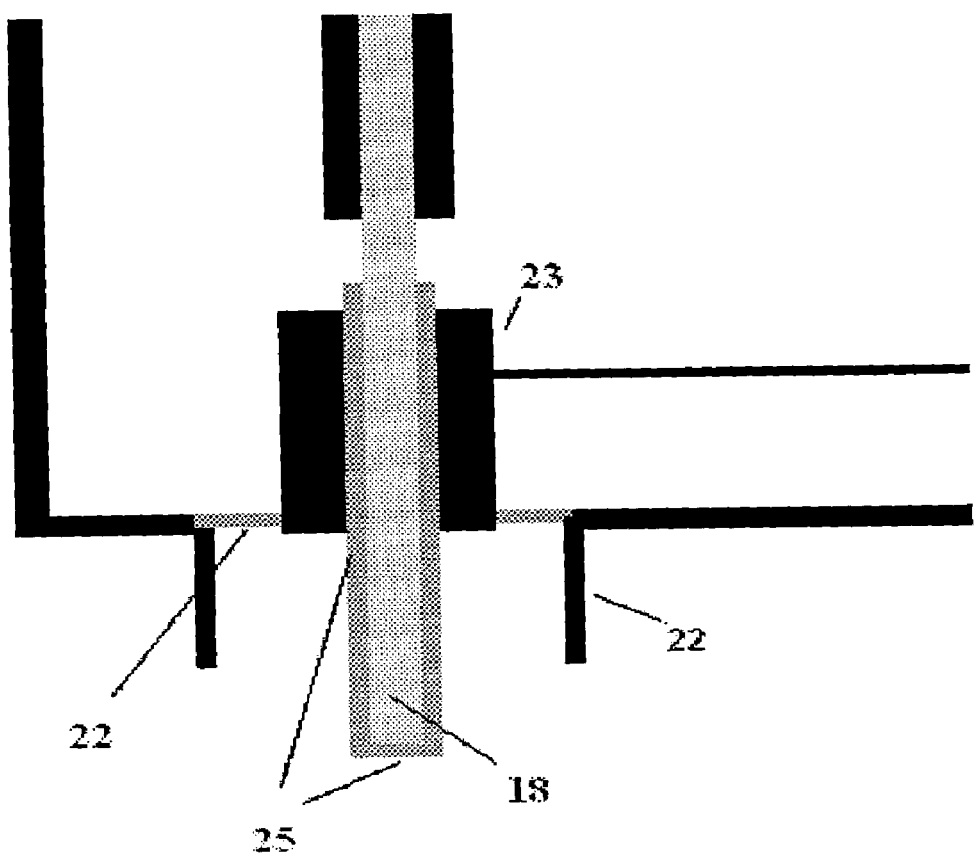
FIG. 3 is a pictorial view of the configuration of the probe's electrode.

The more detailed view of the probe 6, represented in FIG. 2 and FIG. 3, shows the optical fiber 8 with its end 18 coated with a transparent and conducting ITO (Indium-Tin-Oxide) layer 25. The conducting layer 25 is connected to a preamplifier 24 by a metal cylinder 23 installed inside a dielectric ring 22. The output of the signal preamplifier 24 is connected to a signal demodulator 10.

Figure 4:
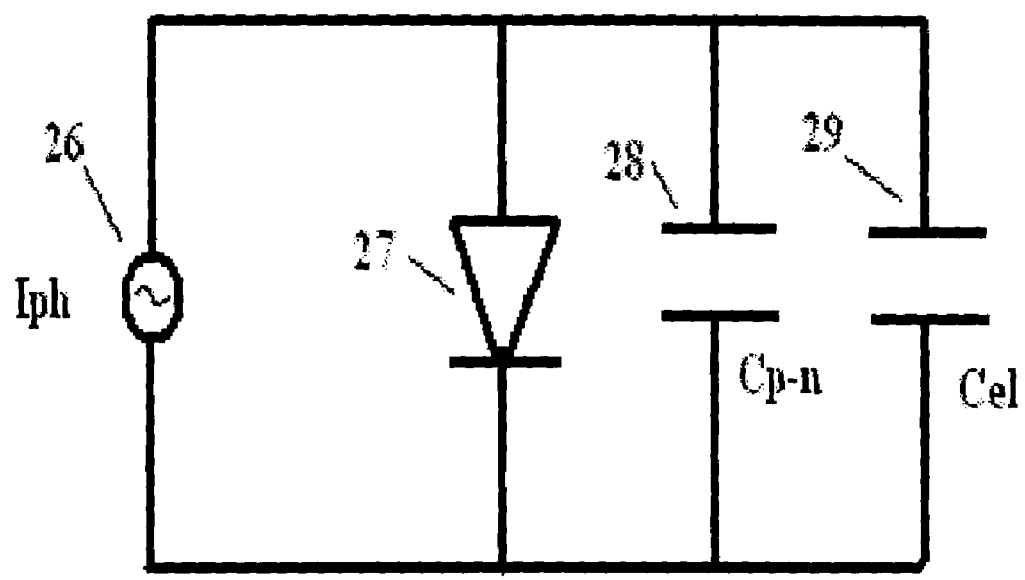
FIG. 4 is a pictorial view of equivalent electronic schematic of p-n junction under illumination.

The fundamentals of the measurement can be described using an equivalent circuit shown in FIG. 4, where Cel 29 is the capacitance of the probe electrode, Cp-n 28 is the junction capacitance, Iph 26 is the junction photo-current under illumination and the p-n junction diode 27, which can be approximated as a resistor for low to modest leakage conditions.

In the case of a sinusoidal modulated light, the junction photo-voltage (JPV) signal in the probe electrode can be represented as:

$$V_{SPV}(t) = V_S \cdot \exp(j\omega \cdot t) = |V_S| \exp(j\theta) \exp(j\omega \cdot t) \quad (1)$$

where $|V_S|$, $\theta$ are the magnitude and phase shift of JPV signal, $V_S$, $\omega = 2\pi f$, and f is the light modulating frequency.

The magnitude and phase shift of the photo-voltages are:

$$|V_S| = \frac{q(1-R)\Phi}{\sqrt{(2\pi f C_{pn})^2 + I_0^2 \left(\frac{q}{kT}\right)^2}} \quad (2)$$

and $$\vartheta = \operatorname{Arctan}\left[\frac{2\pi f C_{pn}}{I_0 \left(\frac{q}{kT}\right)}\right] \quad (3)$$

where:

Φ is the intensity of the light flux on the junction surface;
Cp-n is the capacitance of p-n junction per unit area;
R is the reflectivity of the semiconductor surface.
Io is the prefactor in formula of current, I, versus voltage, V, of p-n junction:

$$I = I_0 \cdot [\exp(q \cdot V/kT) - 1] \quad (4)$$

q is the charge of the electron;
k is Boltzman constant;
T is the measurement temperature.

This invention provides for the use of a junction capacitance calibration wafer to provide for an accurate measurement of leakage current independent of detailed information on the light intensity and surface reflectivity. The calibration wafer should have a surface p-n junction with low leakage current, $Io^*(q/kT) \ll 2\#f_2 Csc$, and a known value of p-n junction capacitance, $C_{pnc}$. In this case, the JPV signal for this calibration p-n junction can be determined using:

$$|V_C| = \mathrm{const}\frac{q(1-R)\Phi}{2\pi f C_C} \quad (5)$$

Leakage for a test junction can be calculated using a set of equations:

$$\frac{|V|}{|V_C|} = \frac{2\pi f_0 C_C}{\sqrt{(2\pi f_0 C_{pn})^2 + I_0^2\left(\frac{q}{kT}\right)^2}} \quad (6)$$

and $$\vartheta = \operatorname{Arctan}\left[\frac{2\pi f_0 C_{pn}}{I_0\left(\frac{q}{kT}\right)}\right] \quad (7)$$

In an alternative method, junction photo-voltages can be measured at two frequencies, $f_1$ and $f_2$, and the leakage current is calculated using the following set of equations:

$$\frac{|V_1|}{|V_C|} = \frac{2\pi f_1 C_C}{\sqrt{(2\pi f_1 C_{pn})^2 + I_0^2\left(\frac{q}{kT}\right)^2}} \quad (8)$$

$$\frac{|V_1|}{|V_2|} = \frac{\sqrt{(2\pi f_2 C_{pn})^2 + I_0^2\left(\frac{q}{kT}\right)^2}}{\sqrt{(2\pi f_1 C_{pn})^2 + I_0^2\left(\frac{q}{kT}\right)^2}} \quad (9)$$

Figure 5:
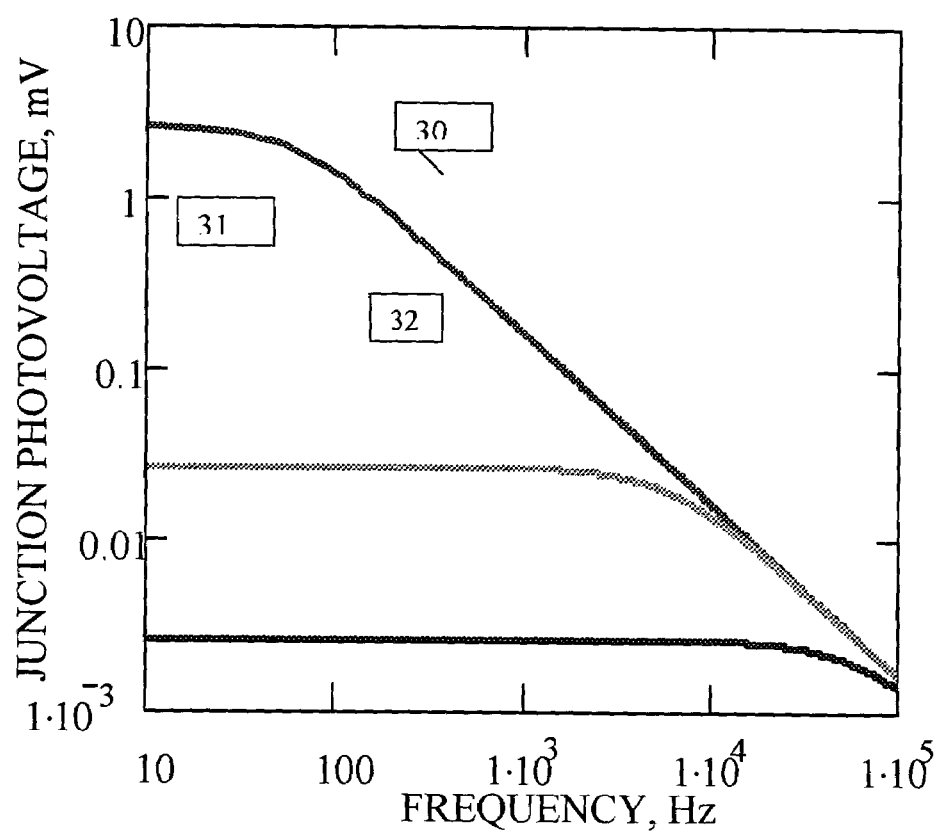
FIG. 5 is a pictorial view of junction photo-voltage dependencies for leaky and not leaky p-n junctions.

As depicted in FIG. 5, the light modulation frequency dependence of the junction photo-voltage (JPV) has region of strong like 1/f dependence if f>fc and at a nearly constant and sharply reduced value JPV for f<fc, where the cutoff frequency, fc, is [qIo/2πkTCpn]. For low-leakage junctions 30, the 1/f behavior extends over a wide range of frequencies and the cutoff frequency is low, near 100 Hz in the example. For increasing leakage current, shown in the behaviors 31, 32, the low and constant voltage signal extends to higher frequencies and the cutoff frequency increases with increasing leakage.

For the best accuracy of this alternative method, the measurement frequencies should be chosen so that $f_1$<fc and $f_2$>fc. For the first, single frequency method, the best signal accuracy is obtained by using a light modulation frequency close to the cutoff value, fo≈fc.

To exclude errors related to wafers thickness differences, or change of the air gap due to differential thermal expansion of different components, an air gap control system is used to maintain a constant air gap or to monitor the air gap and to mathematically correct the JPV signals to a standard gain level. A distance sensor can be used to measure the gap between the sample and the probe; it can be optically based, for example, a laser interferometer, or electrically based measuring the capacitance between the electrodes and the surface junction. The distance information is sent to the computer 12 and the computer will send a signal to the Z motor 19 that moves the probe up and down to compensate for the air gap variation. Distance sensing means comprises a signal generator 20 that applies an AC voltage to the wafer chuck 4, and signal demodulators 11 which connect to the probe electrodes 18 to measure the probe-to-junction capacitance.

In more detail, the first procedure of measurement includes:

a) Placing the calibration semiconductor p-n structure with known capacitance and small leakage current, for example, a deep (>50 um) p-n junction in a 10 Ohm-cm test wafer, on the wafer chuck;

b) Determining the electrode to sample spacing and probe gain level by measurement of the signal voltage from a reference voltage signal on the wafer without light illumination;

c) Illuminating the tested junction area 3 of the product calibration wafer through the end of the fiber 18 connected to a light source 7 with intensity modulated light;

d) Adjustment of the light flux to get linear dependence of the JPV signal, $V_C$, versus light flux;
e) Measuring the JPV signal from the capacitance calibration junction, $V_C$, at frequency f from the electrode 25 using a preamplifier 24 and a signal demodulator 11;
f) Replacing the calibration junction with the junction under test;
g) Measuring the electrode to sample spacing and probe capacitance gain;
h) Use the electrode to sampling spacing information to move the Z motor to maintain the same probe sample spacing as the calibration sample or determine the normalization factor for JPV gain;
i) Repeating the steps c), d), e), f) for the test wafer and measurement of JPV signals $V_t$ from the test area 3 at a frequency f; and
j) Determining Io and Cpn using the parameters of the calibration structure Cc, the measured values from the test wafer $V_1$ and from the calibration wafer $V_C$ and equations (6), (7).

For a high throughput, an LED driver 9 and signal demodulators 11 capable of handling two or more frequencies can be used simultaneously, thus reducing steps k) and l) into a single step.

The second procedure of measurement requires an additional measurement of the JPV signals from the tested area 3 with the transparent electrode 18 at frequencies $f_1$ and $f_2$, using the preamplifiers 24 and signal demodulators 11. Io and Cpn are determined using the parameters of the calibration structure Csc, measured values from the test wafer V at frequency $f_1$ and $V_C$ and from the calibration wafer test wafer $V_C$ at frequency $f_1$ and equations (8), (9).

For high throughput, a light source driver 9 and signal demodulators 10 capable of handling two or more frequencies can be used simultaneously, this reducing the measurement time for the dual-frequency method.

An alternative apparatus for this invention uses a transparent dielectric coating over the probe electrode material. The dielectric coating provides a fixed spacing between the probe electrode 25 and the junction surface 3 when the probe is placed into contact with the p-n junction wafer, for a faster probing operation. The electrical effect of this dielectric coating can be determined by placing the coated probe in contact with the p-n junction and measuring the electrode signal from a reference voltage on the test wafer, measured in the absence of the modulated light beam, provided by a voltage supply 20 which can supply a modulated signal through the switch 19 to the wafer chuck 4.

What is claimed is:

1. A non-contact apparatus for measuring p-n junction leakage current comprising:
    means for illuminating the area of a semiconductor structure with an intensity modulated light, controlled by a computer,
    means for detecting and measurement of the JPV signal inside the illumination area and optically coupled to the illuminating means, and connected to the computer,
    means for monitoring and adjustment of the air gap between the p-n junction and probe electrodes controlled by the computer,
    means for calibration of surface reflectivity on various test wafers,
    an optical system installed in the vicinity of, or directly above, the illumination means and detecting the JPV signal from the tested p-n structure, the optical system being designed for pattern recognition and placing the illumination means and the means for detecting the JPV signal in the vicinity of tested p-n junction, the optical system, including an objective lens and a CCD matrix, connected to the computer, and
    means for wafer positioning, using the leakage measurement in different test p-n junctions, including one or more linear stages and or a rotary stage, the stages being controlled by the computer.

2. The apparatus of claim 1 where the spacing between the junction and the probe electrode is set by the thickness of a transparent dielectric film over the probe electrode, where the outer surface of the dielectric film is placed in contact with the p-n junction.

3. The apparatus of claim 1 wherein the illumination means further comprises a laser diode with drivers forming a modulated illumination and an optical fiber directing light onto the wafer surface.

4. The apparatus of claim 1 wherein the means for detecting JPV signals further comprises a transparent and conducting layer on the end of an optical fiber electrically connected to a preamplifier.

5. The apparatus of claim 1 wherein the means for monitoring and adjustment of the air gap between the wafer and the electrodes includes a vertical motion control and a sensor for measuring the probe-wafer gap between the p-n junction and the probe electrode in which the probe-wafer gap sensor can include electrical, optical and mechanical interactions between the wafer and probe.

6. The apparatus of claim 1 wherein the means for monitoring the air gap between the p-n junction and the probe electrodes includes a voltage generator switch, and connecting the wafer chuck to ground or to a signal generator.

7. The apparatus of claim 1 wherein the calibration means includes a photo detector optically coupled to a transparent electrode for measuring the surface reflectivity.

8. The apparatus of claim 4 wherein the transparent conducting layer on the end of the optical fiber is an ITO coating.

9. The apparatus of claim 1 wherein the illumination means further comprises a light emitting diode (LED) with drivers forming a periodic illumination and an optical fiber directing light onto the wafer surface.

* * * * *